(12) United States Patent
Hsu

(10) Patent No.: US 7,796,448 B2
(45) Date of Patent: Sep. 14, 2010

(54) TRIGGER CIRCUIT OF A COLUMN REDUNDANT CIRCUIT AND RELATED COLUMN REDUNDANT DEVICE

(75) Inventor: Jen-Shou Hsu, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 112 days.

(21) Appl. No.: 12/257,408

(22) Filed: Oct. 24, 2008

(65) Prior Publication Data

US 2009/0268530 A1 Oct. 29, 2009

(30) Foreign Application Priority Data

Apr. 25, 2008 (TW) .............................. 97115294 A

(51) Int. Cl.
G11C 16/04 (2006.01)
(52) U.S. Cl. ............... 365/189.07; 365/200; 365/225.7; 365/230.06
(58) Field of Classification Search ............ 365/189.07, 365/200, 224.7, 230.06, 230.03
See application file for complete search history.

(56) References Cited

U.S. PATENT DOCUMENTS

| 5,933,382 | A | 8/1999 | Yi et al. |
| 5,999,463 | A | 12/1999 | Park et al. |
| 6,535,436 | B2 * | 3/2003 | Brady ........................ 365/200 |
| 7,154,791 | B2 * | 12/2006 | Kim ............................ 365/200 |

* cited by examiner

Primary Examiner—A. Zarabian
(74) Attorney, Agent, or Firm—Winston Hsu

(57) ABSTRACT

A trigger circuit for triggering corresponding memory cells of a column redundant circuit includes a determining circuit for generating a determining signal according to an accessed row address, and a plurality of comparing circuits jointly electrically connected to the column redundant circuit for receiving the determining signal, each of the comparing circuits selectively generating a trigger signal to the column redundant circuit according to the determining signal and an accessed column address.

20 Claims, 5 Drawing Sheets

| Number of row \ Row address | $RA_3$ | $RA_2$ | $RA_1$ | $RA_0$ |
|---|---|---|---|---|
| The 1st row | 0 | 0 | 0 | 0 |
| The 2nd row | 0 | 0 | 0 | 1 |
| The 3rd row | 0 | 0 | 1 | 0 |
| The 4th row | 0 | 0 | 1 | 1 |
| The 5th row | 0 | 1 | 0 | 0 |
| The 6th row | 0 | 1 | 0 | 1 |
| The 7th row | 0 | 1 | 1 | 0 |
| The 8th row | 0 | 1 | 1 | 1 |
| The 9th row | 1 | 0 | 0 | 0 |
| The 10th row | 1 | 0 | 0 | 1 |
| The 11th row | 1 | 0 | 1 | 0 |
| The 12th row | 1 | 0 | 1 | 1 |
| The 13th row | 1 | 1 | 0 | 0 |
| The 14th row | 1 | 1 | 0 | 1 |
| The 15th row | 1 | 1 | 1 | 0 |
| The 16th row | 1 | 1 | 1 | 1 |

FIG. 4

TRIGGER CIRCUIT OF A COLUMN REDUNDANT CIRCUIT AND RELATED COLUMN REDUNDANT DEVICE

BACKGROUND OF THE INVENTION

1. Field of the Invention

The present invention relates to a trigger circuit of a column redundant circuit, and more particularly, to a trigger circuit for a column redundant device.

2. Description of the Prior Art

Please refer to FIG. 1. FIG. 1 is a schematic diagram illustrating a conventional column redundant device 100. As shown in FIG. 1, the column redundant device 100 comprises a column redundant circuit 110 and a trigger circuit 120. The column redundant circuit 110 is also known as a Redundant Column Selection Line (RCSL). The trigger circuit 120 comprises an activation fuse set 121, a comparator 122 and a column address fuse set 123.

The column redundant device 100 is utilized for replacing failed memory cells of a DRAM (Dynamic Random Access Memory). For example, if the memory cell in the $X^{th}$ column and the $Y^{th}$ row is failed, when the DRAM accesses the memory cell in the $X^{th}$ column and the $Y^{th}$ row, the trigger circuit 120 will trigger the column redundant circuit 110 to replace all of the memory cells in the $X^{th}$ column. As a result, the DRAM will not access the failed memory cell. Therefore, the column redundant circuit 110 necessarily comprises a column of memory cells for replacing a column of memory cells having even only one failed memory cell.

In the trigger circuit 120, the column address fuse set 123 is utilized for recording column addresses of the failed memory cells. As mentioned above, if the failed memory cell exists in the $X^{th}$ column and the $Y^{th}$ row, the column address fuse set 123 will record the column address "X". The activation fuse set 121 is utilized for storing signals that determines if the trigger circuit 120 should be enabled (activated). If the signals stored in the activation fuse set 121 determine that the trigger circuit 120 should be enabled, the activation fuse set 121 will enable the comparator 122. On the contrast, if the signals stored in the activation fuse set 121 determine that the trigger circuit 120 should not be enabled, the activation fuse set 121 will not enable the comparator 122. The comparator 122 comprises an activation end, a first input end, a second input end, and an output end. The activation end of the comparator 122 is utilized for receiving signals from the activation fuse set 121 and the comparator 122 is enabled accordingly. The first input end of comparator 122 is utilized for receiving column addresses of the memory cells accessed by the DRAM. The second input end of the comparator 122 is electrically connected to the column address fuse set 123, for receiving the recorded column addresses of the failed memory cells (i.e. the column "X"). When the comparator 122 is enabled, the comparator 122 compares the column address of the memory cell accessed by the DRAM and the recorded column address of the column address fuse set 123. If both are the same, it means that a failed memory cell exists in the column address corresponding to the memory cell accessed by the DRAM, causing the comparator 122 generating a trigger signal to the column redundant circuit 110. When the column redundant circuit 110 receives the trigger signal transmitted from the comparator 122, the column redundant circuit 110 automatically replaces all of the memory cells in the $X^{th}$ column. So, the DRAM accesses the memory cells replaced by the column redundant circuit 110 instead of the failed memory cells.

The drawback of the prior art is when there is a failed memory cell in a column of memory cells, the column redundant circuit 110 replaces the column of memory cells having a failed memory cell with a corresponding column of memory cells. In other words, if there are N failed memory cells spreading in different columns, the column redundant circuit 110 needs N columns of memory cells for replacement. However, there are other usable memory cells in the column of memory cells only having a failed memory cell to be abandoned and wasted, causing the column redundant circuit 110 needs more memory cells to work.

In addition, as long as the DRAM accesses data, the comparator 122 is required to compare the column address of the memory cell accessed with the recorded column addresses of failed memory cells. Since accesses for the column address in the DRAM are faster and more than that for the row address, the comparator 122 is required to compare frequently, causing considerable power consumption.

SUMMARY OF THE INVENTION

It is therefore a primary objective of the claimed invention to provide a trigger circuit of a column redundant circuit, which can saves power consumption and is more convenient for users.

The present invention discloses a trigger circuit for triggering corresponding memory cells of a column redundant circuit. The trigger circuit comprises a determining circuit for generating a determining signal according to an accessed row address, and a plurality of comparing circuits jointly electrically connected to the column redundant circuit for receiving the determining signal, each of the comparing circuits selectively generating a trigger signal to the column redundant circuit according to the determining signal and an accessed column address.

The present invention further discloses a column redundant device, which comprises a column redundant circuit and a trigger circuit. The column redundant circuit comprises a first column redundant memory cell, and a second column redundant memory cell. The trigger circuit is utilized for triggering the first or second column redundant memory cell of the column redundant circuit respectively for replacing a first failed memory cell or a second failed memory cell when a memory accesses the first memory cell or the second failed memory cell. The first failed memory cell comprises a first failed column address and a first failed row address. The second failed memory cell comprises a second failed column address and a second failed row address. The trigger circuit comprises a determining circuit for generating a determining signal according to an accessed row address, and a first comparing circuit and a second comparing circuit, jointly electrically connected to the column redundant circuit for receiving the determining signal respectively, the first comparing circuit generating a first trigger signal to the column redundant circuit according to the determining signal and an accessed column address, the second comparing circuit generating a second trigger signal to the column redundant circuit according to the determining signal and the accessed column address.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a schematic diagram of bits of the row address.

DETAILED DESCRIPTION

Figure 1:
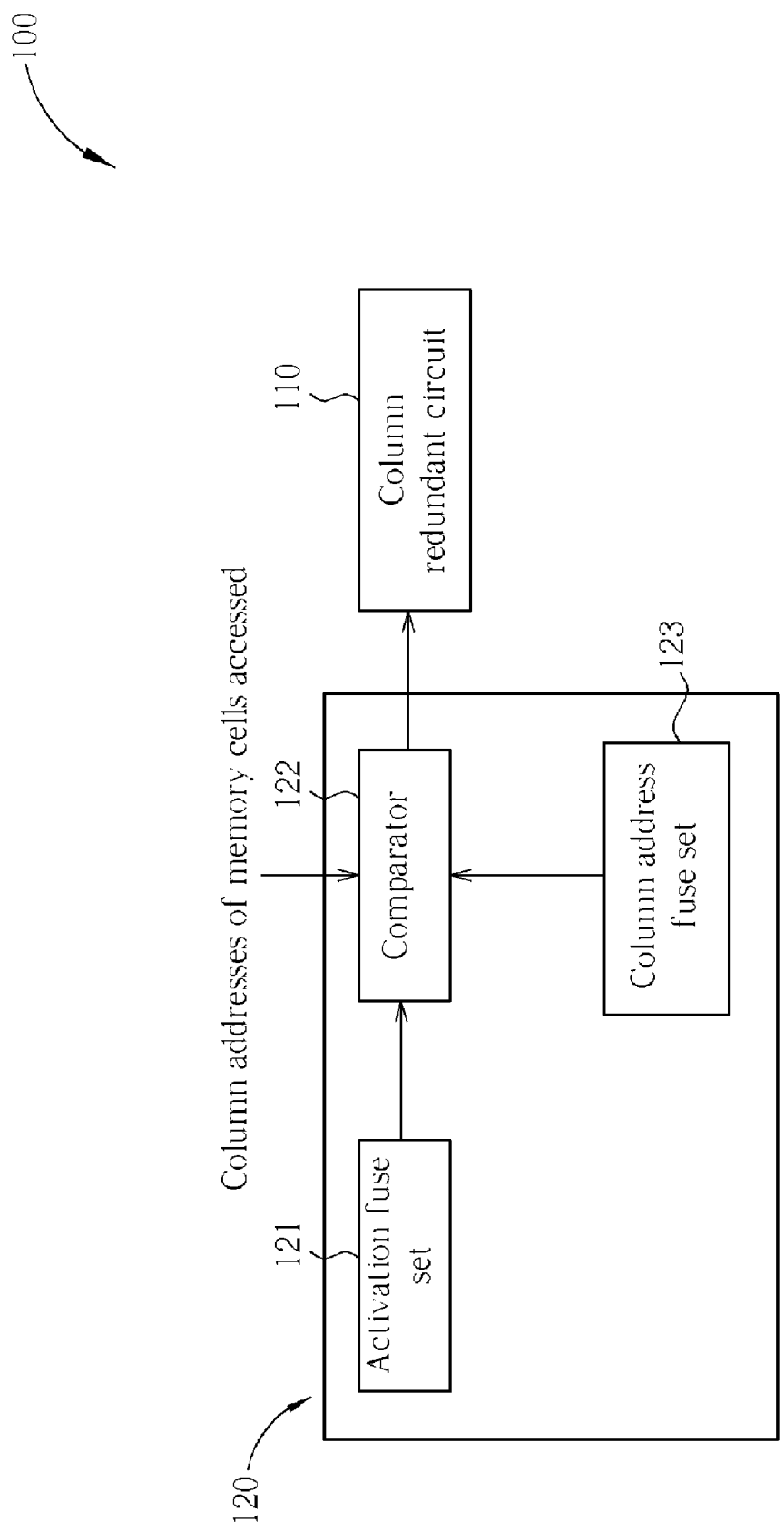
FIG. 1 is a schematic diagram illustrating a conventional column redundant device.
Figure 2:
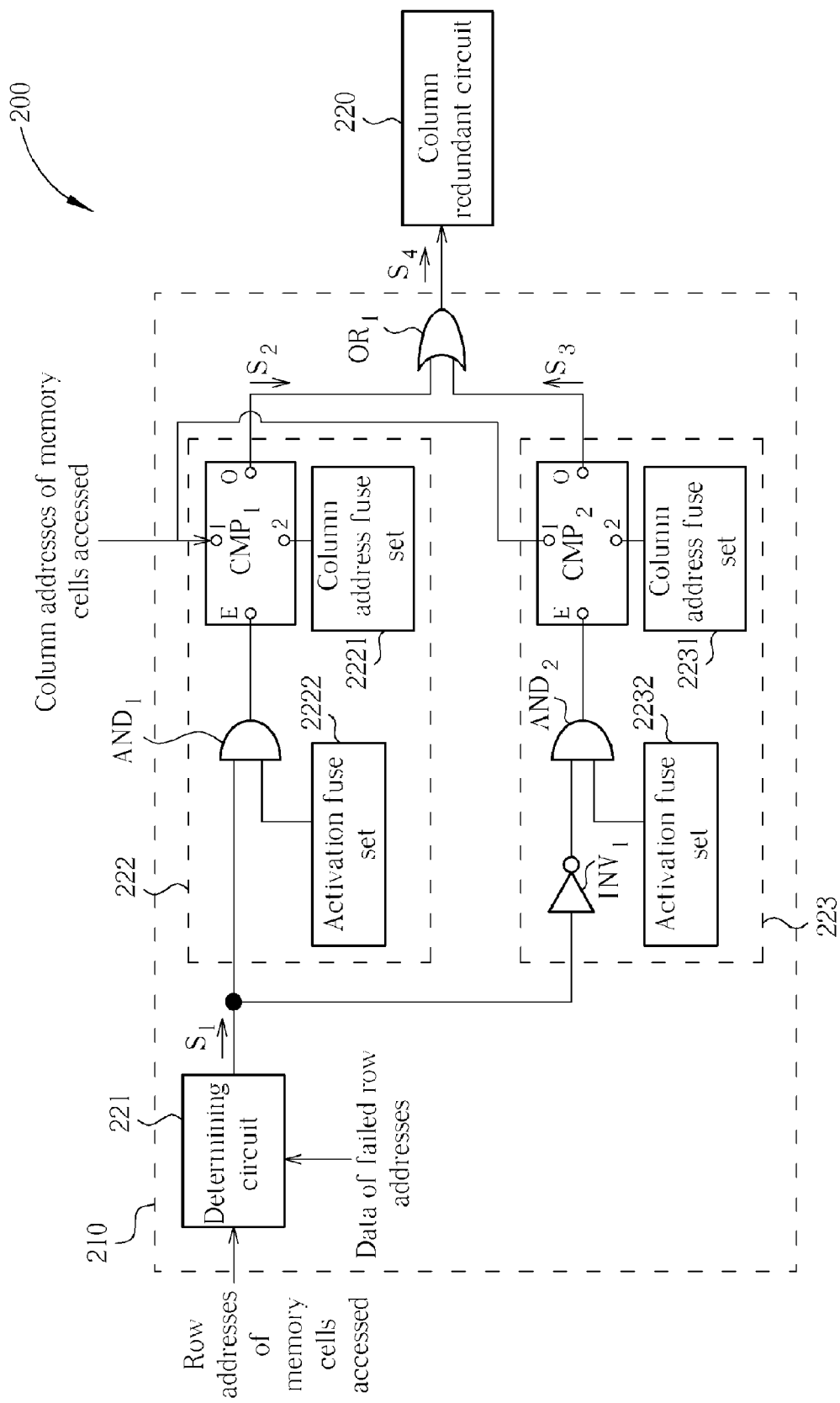
FIG. 2 is a schematic diagram of a column redundant device of a DRAM according to an embodiment of the present invention.

Please refer to FIG. 2. FIG. 2 is a schematic diagram of a column redundant device 200 of a DRAM according to an embodiment of the present invention. The column redundant device 200 comprises a trigger circuit 210 and a column redundant circuit 220. The trigger circuit 210 comprises a determining circuit 221, a comparing circuit 222, a comparing circuit 223, and a logic gate $OR_1$. The logic gate $OR_1$ can be an "OR" gate. The comparing circuit 222 comprises an activation-determining module $AND_1$, a comparator $CMP_1$, a column address fuse set 2221 and an activation fuse set 2222. The comparing circuit 223 comprises an inverter $INV_1$, an activation-determining module $AND_2$, a comparator $CMP_2$, a column address fuse set 2231 and an activation fuse set 2232. The activation-determining modules $AND_1$ and $AND_2$ can be "AND" gates.

The determining circuit 221 is utilized for receiving a row address of a memory cell accessed by the DRAM, and transmitting a determining signal $S_1$ to the activation-determining module $AND_1$ and the inverter $INV_1$ according to a failed row address data.

In the comparing circuit 222, the activation-determining module $AND_1$ comprises two input ends and an output end. One input end of the activation-determining module $AND_1$ is electrically connected to an output end of the determining circuit 221, the other input end of the activation-determining module $AND_1$ is electrically connected to the activation fuse set 2222, and the output end of the activation-determining module $AND_1$ is electrically connected to an activation end of the comparator $CMP_1$. The activation-determining module $AND_1$ performs "AND" operation on the determining signal $S_1$ and data stored in the activation fuse set 2222 for enabling the comparator $CMP_1$. More precisely, only when the determining signal $S_1$ and data stored in the activation fuse set 2222 are both logic "1", the comparator $CMP_1$ is enabled. When either of the determining signal $S_1$ and data stored in the activation fuse set 2222 is not logic "1", the comparator $CMP_1$ is not enabled. The comparator $CMP_1$ comprises an activation end E, a first input end 1, a second input end 2 and an output end O. The activation end E of the comparator $CMP_1$ is electrically connected to the output end of the activation-determining module $AND_1$. When the activation-determining module $AND_1$ generates logic "1", the comparator $CMP_1$ is enabled. The first input end 1 of the comparator $CMP_1$ is utilized for receiving a column address of a memory cell accessed by the memory. The second input end 2 of the comparator $CMP_1$ is electrically connected to the column address fuse set 2221, for receiving a column address of a failed memory cell (i.e. the column "P", or the $P^{th}$ column). When the comparator $CMP_1$ is enabled, the comparator $CMP_1$ compares the column address of the memory cell accessed by the memory and the recorded column address of the failed memory cell (the column "P"). If both are the same, it means that a failed memory cell exists in the column address corresponding to the memory cell accessed by the memory, causing the comparator $CMP_1$ to generate a trigger signal $S_2$, which is transmitted to the column redundant circuit 220 via the logic gate $OR_1$.

In the comparing circuit 223, the inverter $INV_1$ is electrically connected to the output end of the determining circuit 221, for inverting the determining signal $S_1$. The activation-determining module $AND_2$ comprises two input ends and an output end. One input end of the activation-determining module $AND_2$ is electrically connected to an output end of the inverter $INV_1$, the other input end of the activation-determining module $AND_2$ is electrically connected to the activation fuse set 2232, and the output end of the activation-determining module $AND_2$ is electrically connected to the activation end of the comparator $CMP_2$. The activation-determining module $AND_2$ performs "AND" operation on the inverted signal of the determining signal $S_1$ and data stored in the activation fuse set 2232 for enabling the comparator $CMP_2$. More precisely, only when the determining signal $S_1$ is logic "0" and data stored in the activation fuse set 2232 is logic "1", the comparator $CMP_2$ is enabled. In other situations, the comparator $CMP_2$ is not enabled. The comparator $CMP_2$ comprises an activation end E, a first input end 1, a second input end 2, and an output end O. The activation end E of the comparator $CMP_2$ is electrically connected to the output end of the activation-determining module $AND_2$. When the activation-determining module $AND_2$ generates logic "1", the comparator $CMP_2$ is enabled. The first input end 1 of the comparator $CMP_2$ is utilized for receiving a column address of a memory cell accessed by the memory. The second input end 2 of the comparator $CMP_2$ is electrically connected to the column address fuse set 2231, for receiving a column address of a failed memory cell (i.e. the column "Q", or the $Q^{th}$ column). When the comparator $CMP_2$ is enabled, the comparator $CMP_2$ compares the column address of the memory cell accessed by the memory and the recorded column address of the failed memory cell (the column "Q"). If both are the same, it means that a failed memory cell exists in the column address corresponding to the memory cell accessed by the memory, causing the comparator $CMP_2$ to generate a trigger signal $S_3$, which is transmitted to the column redundant circuit 220 via the logic gate $OR_1$.

The logic gate $OR_1$ performs "OR" operation on the received trigger signals $S_2$ and $S_3$, and accordingly generates a trigger signal $S_4$ to the column redundant circuit 220. In other words, either the trigger signal $S_2$ or the trigger signal $S_3$ is generated, the column redundant circuit 220 receives the trigger signal $S_4$.

The column address of the failed memory cell recorded in the column address fuse set 2221 and that recorded in the column address fuse set 2231 can be different (i.e. the above-mentioned columns "P" and "Q"). Namely, the comparing circuits 222 and 223 can compare memory cells in different columns respectively, and use the column redundant memory cells in the same column of the column redundant circuit 220 for replacing the failed memory cells in different columns. More particularly, memory cells of one column in the column redundant circuit 220 can be used for replacing failed memory cells in different columns. For example, if a failed memory cell exists in the $15^{th}$ row of the column "P" and another failed memory cell exists in the $16^{th}$ row of the column "Q", when the DRAM accesses the memory cell in the column "P" and the $15^{th}$ row, the column redundant circuit 220 can use a column redundant memory cell in a column corresponding to the $15^{th}$ row to replace the memory cell in the column "P" and the $15^{th}$ row, and when the DRAM accesses the memory cell in the column "Q" and the $16^{th}$ row, the column redundant circuit 220 can use a column redundant memory cell in the same column corresponding to the 16$^{th}$ row to replace the memory cell in the column "Q" and the 16$^{th}$ row. As a result, compared to the prior art requiring two columns of the column redundant memory cells in this situation, the present invention only requires one column of the column redundant memory cells, so as to save memory cells used.

Figure 3:
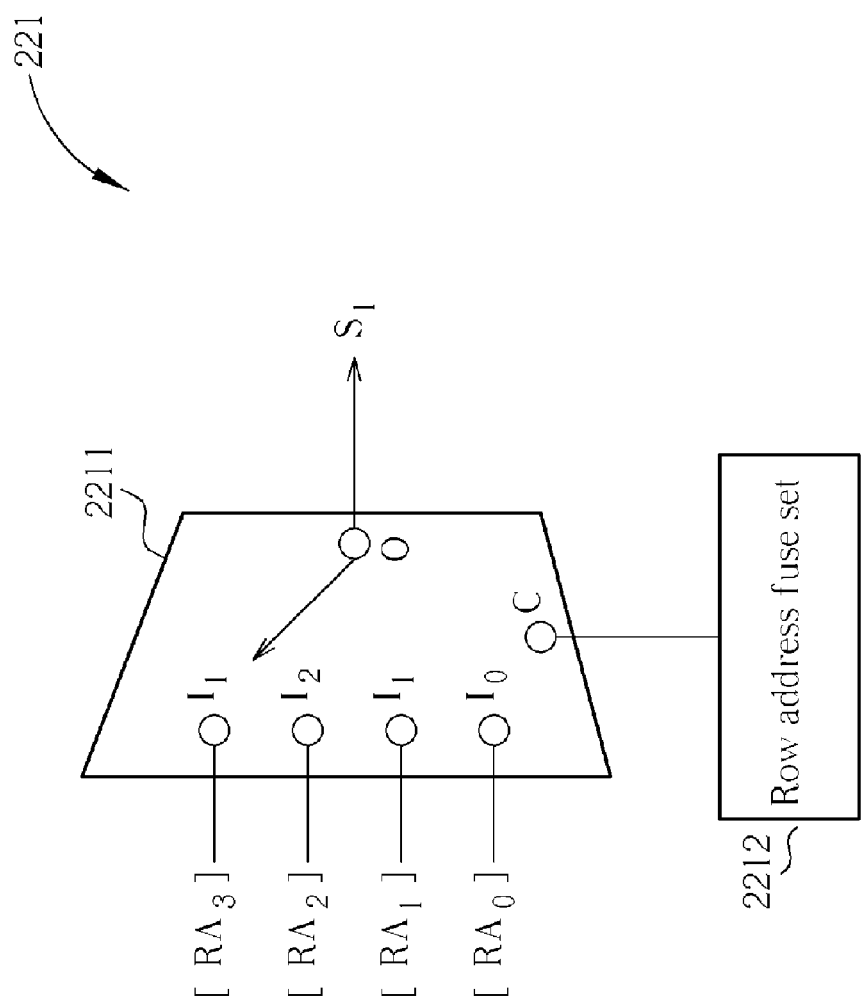
FIG. 3 is a schematic diagram of a determining circuit according to an embodiment of the present invention.

Please refer to FIG. 3. FIG. 3 is a schematic diagram of the determining circuit 221 according to an embodiment of the present invention. As shown in FIG. 3, the determining circuit 221 can be realized with a multiplexer 2211 and a row address fuse set 2212. The multiplexer 2211 comprises four input ends $I_1$, $I_2$, $I_3$, and $I_4$, a control end C, and an output end O. The input ends $I_1$, $I_2$, $I_3$, and $I_4$ of the multiplexer 2211 are respectively utilized for receiving different bits of the row address of the memory cell the DRAM accessed. The present embodiment assumes the row address of the memory cell the DRAM accessed to be four bits for example, but number of bits is not limited. The row address fuse set 2212 is electrically connected to the control end C of the multiplexer 2211 and is utilized for providing a predefined failed row address data to the multiplexer 2211 for controlling one of the input ends $I_1$, $I_2$, $I_3$, and $I_4$ of the multiplexer 2211 to electrically connect to the output end of the multiplexer 2211, so as to transmit one bit out of the row address of the memory cells accessed by the DRAM as the determining signal $S_1$. In FIG. 3, $RA_3$ represents the highest bit (the 4$^{th}$ bit) of the row address, $RA_2$ represents the second highest bit (the 3$^{th}$ bit) of the row address, $RA_1$ represents the second lowest bit (the 2$^{th}$ bit) of the row address, and $RA_0$ represents the lowest bit (the 1$^{th}$ bit) of the row address. The row address fuse set 2212 controls the multiplexer 2211 to transmit one bit of the row address (namely, one of $RA_3$, $RA_2$, $RA_1$, and $RA_0$) to the output end O as the determining signal $S_1$.

Please refer to FIG. 4 and FIG. 3. FIG. 4 is a schematic diagram of the bits of the row address. As shown in FIG. 4, every row has corresponding row address. For example, the row address of the 16$^{th}$ row is [1111], and values of $RA_3$, $RA_2$, $RA_1$, and $RA_0$ are all 1. The row address of the 15$^{th}$ row is [1110], and values of $RA_3$, $RA_2$ and $RA_1$ are all 1 except that value of $RA_0$ is 0. When one memory cell in the column "P" and the 15$^{th}$ row of the DRAM is failed (failed memory cell 1) and another memory cell in the column "Q" and the 16$^{th}$ row of the DRAM is failed (failed memory cell 2), the row address fuse set 2212 configures the input ends $I_4$ of the multiplexer 2211 electrically connected to the output end O of the multiplexer 2211. As a result, the determining signal $S_1$ is $RA_0$, which is utilized for distinguishing memory cells of the 16$^{th}$ row and the 15$^{th}$ row. When the memory cell accessed by the DRAM is in the 16$^{th}$ row, the determining signal $S_1$ is set as logic "1". So, the comparing circuit 222 is enabled to determine if the memory cell accessed by the DRAM is in the column "P". If so, the trigger signal $S_4$ is transmitted to the column redundant circuit 220 to replace the failed memory cell. When the memory cell accessed by the DRAM is in the 15$^{th}$ row, the determining signal $S_1$ is set as logic "0". So, the comparing circuit 223 is enabled to determine if the memory cell accessed by the DRAM is in the column "Q". If so, the trigger signal $S_4$ is transmitted to the column redundant circuit 220 to replace the failed memory cell with a memory cell in the same column but in different row.

Figure 5:
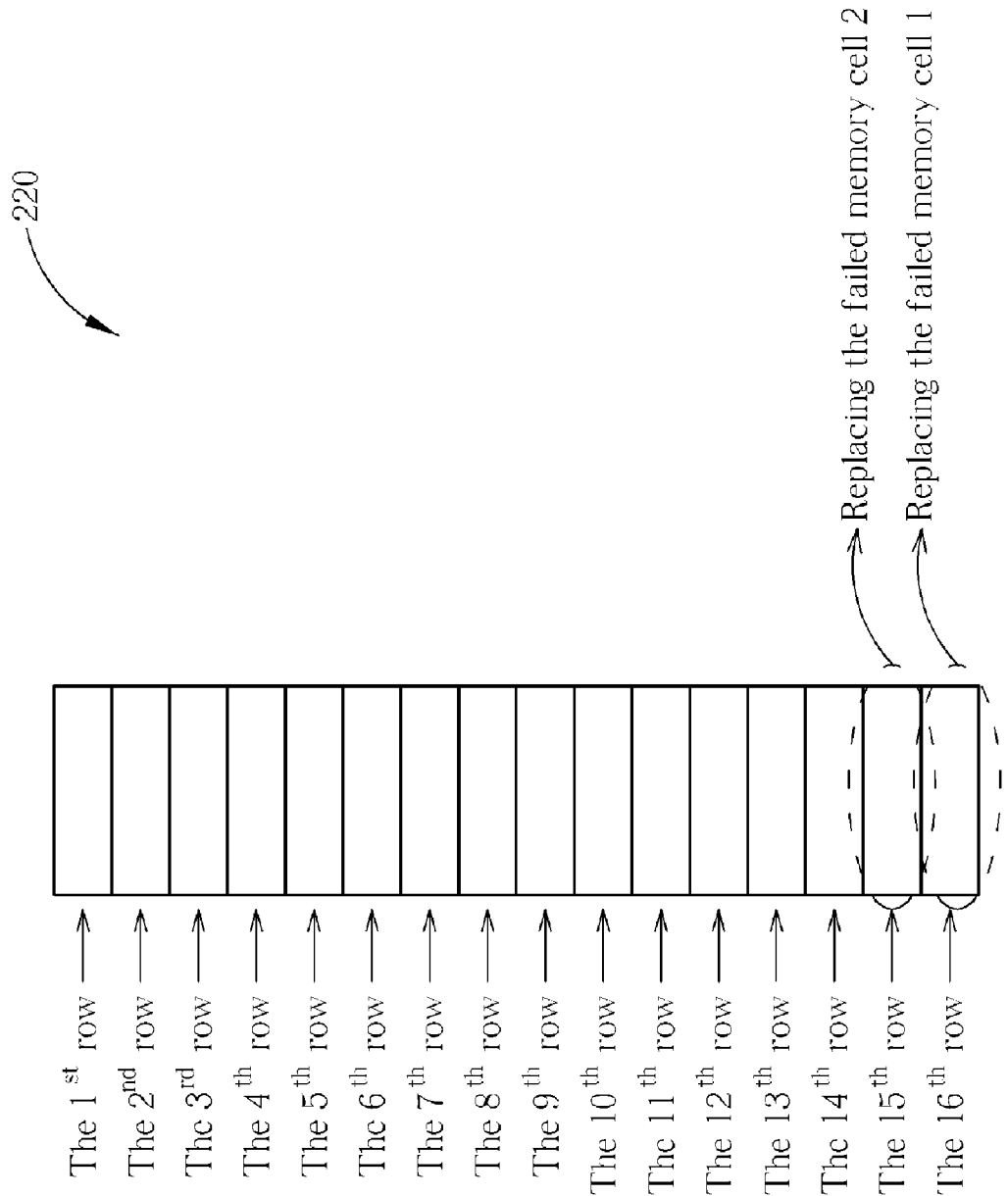
FIG. 5 is a schematic diagram of the column redundant circuit.

Please refer to FIG. 5. FIG. 5 is a schematic diagram of the column redundant circuit 220. As shown in FIG. 5, the column redundant circuit 220 may be realized with memory cells in one single column. In this embodiment, there are 16 rows. That is, the column redundant circuit 220 comprises 16 memory cells in a same column. The memory cell in the 16$^{th}$ row can be utilized for replacing the failed memory cell 1, and the memory cell in the 15$^{th}$ row can be utilized for replacing the failed memory cell 2. Compared to the prior art, if the failed memory cells 1, and 2 are in different columns, two columns of the column redundant memory cells are needed. But in the present invention, only one column of the column redundant memory cells is needed, such that saving cost.

In conclusion, in the present invention, the column redundant device can replace failed memory cell of different columns with the same column memory cell, such that saving memory cells used. Moreover, the column redundant device does not need to compare that if the column address of the memory cell accessed is the column address of the failed memory cell as long as the DRAM accesses the memory cell, which saves power consumption and is more convenient for users.

Those skilled in the art will readily observe that numerous modifications and alterations of the device and method may be made while retaining the teachings of the invention.

What is claimed is:

1. A trigger circuit for triggering corresponding memory cells of a column redundant circuit, the trigger circuit comprising:
   a determining circuit for generating a determining signal according to an accessed row address, the determining circuit comprising:
   a row address fuse set for providing a predefined failed row address data; and
   a selecting circuit for generating the determining signal according to the predefined failed row address data and the accessed row address; and
   a plurality of comparing circuits jointly electrically connected to the column redundant circuit for receiving the determining signal, each of the comparing circuits selectively generating a trigger signal to the column redundant circuit according to the determining signal and an accessed column address.

2. The trigger circuit of claim 1, wherein when the plurality of comparing circuits receive the determining signal, at most one of the comparing circuits generates the trigger signal to the column redundant circuit.

3. The trigger circuit of claim 1 further comprising a logic gate electrically connected between the plurality of comparing circuits and the column redundant circuit, for performing operations on the trigger signals generated from each of the comparing circuits to trigger the column redundant circuit.

4. The trigger circuit of claim 1, wherein the selecting circuit is a multiplexer and the multiplexer selectively outputs a bit address of the accessed row address according to the predefined failed row address data, so as to generate the determining signal.

5. The trigger circuit of claim 1, wherein the column redundant circuit is utilized for replacing a first or second failed memory cells of a memory, and when a first comparing circuit of the plurality of comparing circuits outputs the trigger signal, a first column redundant memory cell of the column redundant circuit is triggered to replace the first failed memory cell; when a second comparing circuit of the plurality of comparing circuits outputs the trigger signal, a second column redundant memory cell of the column redundant circuit is triggered to replace the second failed memory cell.

6. The trigger circuit of claim 5, wherein the first failed memory cell comprises a first failed column address and a first failed row address, and the second failed memory cell comprises a second failed column address and a second failed row address; the predefined failed column address data is utilized for distinguishing a different bit between the first failed row address and the second failed row address.

7. The trigger circuit of claim 1, wherein each of the comparing circuits comprises:
   a column address fuse set for providing a predefined failed column address data;
   an activation fuse set for providing an activation signal;

an activation-determining module for providing an enabling signal according to the activation signal; and a comparing module selectively generating the trigger signal to the column redundant circuit according to the enabling signal, the predefined failed column address data and the accessed column address.

8. The trigger circuit of claim 7, wherein the activation-determining module comprises an AND gate, electrically connected to the activation fuse set and the determining circuit, for generating the enabling signal.

9. A column redundant device comprising:

a column redundant circuit comprising:

a first column redundant memory cell; and a second column redundant memory cell; and a trigger circuit for triggering the first or second column redundant memory cell of the column redundant circuit respectively for replacing a first failed memory cell or a second failed memory cell when a memory accessing the first memory cell or the second failed memory cell, the first failed memory cell comprising a first failed column address and a first failed row address, the second failed memory cell comprising a second failed column address and a second failed row address, the trigger circuit comprising:

a determining circuit for generating a determining signal according to an accessed row address; and a first comparing circuit and a second comparing circuit, jointly electrically connected to the column redundant circuit for receiving the determining signal respectively, the first comparing circuit generating a first trigger signal to the column redundant circuit according to the determining signal and an accessed column address, the second comparing circuit generating a second trigger signal to the column redundant circuit according to the determining signal and the accessed column address.

10. The column redundant device of claim 9, wherein when the first comparing circuit and the second comparing circuit receive the determining signal, either the first comparing circuit generates the first trigger signal to the column redundant circuit, or the second comparing circuit generates the second trigger signal to the column redundant circuit.

11. The column redundant device of claim 9 further comprising a logic gate electrically connected between the first comparing circuit, the second comparing circuit and the column redundant circuit, for performing operations on the first or the second trigger signals respectively generated from the first and second comparing circuits to trigger the column redundant circuit.

12. The column redundant device of claim 9, wherein the determining circuit comprises:

a row address fuse set for providing a predefined failed row address data, utilized for distinguishing the first failed row address and the second failed row address; and a selecting circuit for generating the determining signal according to the predefined failed row address data and the accessed row address.

13. The column redundant device of claim 12, wherein the selecting circuit is a multiplexer and the multiplexer selectively outputs a bit address of the accessed row address according to the predefined failed row address data, so as to generate the determining signal.

14. The column redundant device of claim 12, wherein when the first comparing circuit generates the first trigger signal, the first column redundant memory cell of the column redundant circuit is triggered to replace the first failed memory cell; when the second comparing circuit generates the second trigger signal, the second column redundant memory cell of the column redundant circuit is triggered to replace the second failed memory cell.

15. The column redundant device of claim 9, wherein the first comparing circuit comprises:

a column address fuse set for providing a predefined failed column address data;

an activation fuse set for providing an activation signal;

an activation-determining module for providing an enabling signal according to the activation signal; and a comparing module selectively generating the first trigger signal to the column redundant circuit according to the enabling signal, the predefined failed column address data and the accessed column address;

the second comparing circuit comprises:

a column address fuse set for providing a predefined failed column address data;

an activation fuse set for providing an activation signal;

an activation-determining module for providing an enabling signal according to the activation signal; and a comparing module selectively generating the second trigger signal to the column redundant circuit according to the enabling signal, the predefined failed column address data and the accessed column address.

16. The column redundant device of claim 15, wherein the activation-determining module comprises an AND gate, electrically connected to the activation fuse set and the determining circuit, for generating the enabling signal.

17. The column redundant device of claim 15, wherein the second comparing circuit further comprises an inverter, an input end of the inverter is coupled to the determining circuit, and an output end of the inverter is coupled to the second comparing circuit.

18. A trigger circuit for triggering corresponding memory cells of a column redundant circuit, the trigger circuit comprising:

a determining circuit for generating a determining signal according to an accessed row address; and a plurality of comparing circuits jointly electrically connected to the column redundant circuit for receiving the determining signal, each of the comparing circuits selectively generating a trigger signal to the column redundant circuit according to the determining signal and an accessed column address, each of the comparing circuits comprising:

a column address fuse set for providing a predefined failed column address data;

an activation fuse set for providing an activation signal;

an activation-determining module for providing an enabling signal according to the activation signal; and a comparing module selectively generating the trigger signal to the column redundant circuit according to the enabling signal, the predefined failed column address data and the accessed column address.

19. The trigger circuit of claim 18, wherein the activation-determining module comprises an AND gate, electrically connected to the activation fuse set and the determining circuit, for generating the enabling signal.

20. The trigger circuit of claim 18, wherein the determining circuit comprises:

a row address fuse set for providing a predefined failed row address data; and a selecting circuit for generating the determining signal according to the predefined failed row address data and the accessed row address.

* * * * *